(12) United States Patent
Wu et al.

(10) Patent No.: US 10,649,568 B2
(45) Date of Patent: May 12, 2020

(54) ARRAY SUBSTRATE WITH AUXILIARY GATE METAL PATTERN FOR COMMON ELECTRODE CONNECTION AND METHOD FOR MANUFACTURING THE SAME, TOUCH DISPLAY PANEL AND TOUCH DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Xinguo Wu, Beijing (CN); Fengguo Wang, Beijing (CN); Dawei Shi, Beijing (CN); Hong Liu, Beijing (CN); Feng Li, Beijing (CN); Zifeng Wang, Beijing (CN); Bo Ma, Beijing (CN); Zhixuan Guo, Beijing (CN); Yuanbo Li, Beijing (CN); Cenhong Duan, Beijing (CN); Jing Zhao, Beijing (CN)

(73) Assignees: BOE TECHNOLOGY GROUP CO., LTD., Beijing (CN); ORDOS YUANSHENG OPTOELECTRONICS CO., LTD., Ordos, Iner Mongolia (CN)

( * ) Notice: Subject to any disclaimer, the term of this patent is extended or adjusted under 35 U.S.C. 154(b) by 0 days.

(21) Appl. No.: 16/157,227

(22) Filed: Oct. 11, 2018

(65) Prior Publication Data
US 2019/0121477 A1    Apr. 25, 2019

(30) Foreign Application Priority Data

Oct. 23, 2017  (CN) .......................... 2017 1 0992869

(51) Int. Cl.
G06F 3/041 (2006.01)
G06F 3/044 (2006.01)
(Continued)

(52) U.S. Cl.
CPC ............ G06F 3/0412 (2013.01); G06F 3/044 (2013.01); *G02F 1/1345* (2013.01);
(Continued)

(58) Field of Classification Search
CPC .................. G06F 3/0412; G06F 3/044; G06F 2203/04103; H01L 27/1259;
(Continued)

(56) References Cited

U.S. PATENT DOCUMENTS

2011/0157039 A1* 6/2011 Shin ..................... G02F 1/13338
345/173
2016/0266706 A1* 9/2016 Lu .......................... G06F 3/0416
(Continued)

*Primary Examiner* — Darlene M Ritchie
(74) *Attorney, Agent, or Firm* — Brooks Kushman P.C.

(57) ABSTRACT

An array substrate and a method for manufacturing the same, a display panel and a display device are provided. The array substrate includes: a substrate; a gate metal layer arranged on the substrate, the gate metal layer including a gate line and a patterned auxiliary metal; a source and drain metal layer, the source and drain metal layer including source signal lines and touch signal lines, and the source and drain metal layer being separated from the gate metal layer by an insulating layer; a planarization layer arranged on the source and drain metal layer; and a common electrode arranged on the planarization layer. The patterned auxiliary metal is electrically connected to the touch signal lines through first holes penetrating the insulating layer, and is electrically connected to the common electrode through second holes penetrating the insulating layer and third holes penetrating the planarization layer.

17 Claims, 3 Drawing Sheets

(51) Int. Cl.
    *G02F 1/1345*     (2006.01)
    *H01L 23/522*     (2006.01)
    *H01L 21/768*     (2006.01)
    *H01L 23/48*     (2006.01)

(52) U.S. Cl.
    CPC .................... *G06F 2203/04103* (2013.01); *H01L 21/7684* (2013.01); *H01L 21/76877* (2013.01); *H01L 23/481* (2013.01); *H01L 23/5226* (2013.01)

(58) Field of Classification Search
    CPC ......... H01L 27/76877; H01L 27/76879; H01L 27/7684; H01L 23/481; H01L 23/5222; H01L 23/5226; G02F 1/1345
    See application file for complete search history.

(56) References Cited

U.S. PATENT DOCUMENTS

| | | | | |
|---|---|---|---|---|
| 2016/0320882 | A1* | 11/2016 | Kim | G06F 3/044 |
| 2017/0060317 | A1* | 3/2017 | Kim | G06F 3/0416 |
| 2017/0176798 | A1* | 6/2017 | Ahn | G02F 1/1345 |
| 2017/0185194 | A1* | 6/2017 | Kim | G06F 3/0412 |
| 2018/0188867 | A1* | 7/2018 | Yeh | G06F 3/0416 |
| 2018/0335916 | A1* | 11/2018 | Hao | G06F 3/0488 |
| 2018/0373079 | A1* | 12/2018 | Yeh | G02F 1/13338 |

* cited by examiner

ARRAY SUBSTRATE WITH AUXILIARY GATE METAL PATTERN FOR COMMON ELECTRODE CONNECTION AND METHOD FOR MANUFACTURING THE SAME, TOUCH DISPLAY PANEL AND TOUCH DISPLAY DEVICE

CROSS REFERENCE OF RELATED APPLICATION

This application claims priority to Chinese patent application No. 201710992869.2, filed on Oct. 23, 2017, which is incorporated herein by reference in its entirety.

TECHNICAL FIELD

The present disclosure relates to the field of display technology, and in particular to an array substrate and a method for manufacturing the array substrate, a display panel and a display device.

BACKGROUND

With the development of low temperature poly-Silicon (LTPS) and in-cell touch display panels, requirements on the production process and design of the touch display panels are becoming higher. The in-cell touch display panel commonly used in the related art includes a hybrid in-cell (HIC) touch display panel and a full in-cell (FIC) touch display panel. The FIC touch display panel is more widely used, and the FIC can be designed to have a structure for the time-division multiplexing of a common electrode, so as to realize the compactness of the display panel. That is to say, when the display panel implements the touch function, the common electrode can be used as a touch sensing element to realize touch sensing; and when the display panel implements the display function, the common electrode can be used as a display element to implement screen display.

The FIC mode works by electrically connecting a touch signal line arranged in the same layer as a source and drain signal line to the common electrode, and using the common electrode as a touch electrode for sensing a capacitance change caused by a touch, thereby realizing the touch function. However, a contact resistance between the touch signal line and the common electrode is large, and the resistance of the common electrode itself is also large, which results in poor display performance and reduces touch sensitivity of the touch display panel, thereby causing the yield of the touch display panel to be low.

SUMMARY

In a first aspect of the present disclosure, an array substrate is provided, which includes:

a substrate;

a gate metal layer arranged on the substrate, the gate metal layer including a gate line and a patterned auxiliary metal;

a source and drain metal layer, the source and drain metal layer including source signal lines and touch signal lines, and the source and drain metal layer being separated from the gate metal layer by an insulating layer;

a planarization layer arranged on the source and drain metal layer; and a common electrode arranged on the planarization layer, where the patterned auxiliary metal is electrically connected to the touch signal lines through first holes penetrating the insulating layer, and is electrically connected to the common electrode through second holes penetrating the insulating layer and third holes penetrating the planarization layer.

Optionally, the array substrate includes a plurality of touch units arranged in an array. The patterned auxiliary metal for each of the plurality of touch units is broken off at a boundary of the each touch unit.

Optionally, the patterned auxiliary metal includes at least one strip-type auxiliary metal parallel to the gate line.

Optionally, the array substrate includes a plurality of touch units arranged in an array, each of the plurality of touch units includes at least one touch signal line, and each of the at least one touch signal line is electrically connected to the common electrode through a plurality of fourth holes penetrating the planarization layer.

Optionally, the second holes in the insulating layer are arranged to be communicated with the third holes in the planarization layer correspondingly.

Optionally, each of the second holes and the corresponding third hole are coaxial.

Optionally, a diameter of each of the third holes is larger than a diameter of the corresponding second hole.

In a second aspect of the present disclosure, a touch display panel is provided, and the touch display panel includes the array substrate as described in the first aspect.

Optionally, the common electrode is used to display an image in a display period of the touch display panel, and the common electrode is used as a touch electrode for sensing a touch operation in a touch period of the touch display panel.

Optionally, the touch signal lines provide common electrode signals for the common electrode in the display period, and the touch signal lines transmit touch signals to the common electrode via the patterned auxiliary metal in the touch period.

In a third aspect of the present disclosure, a touch display device is provided, the touch display device includes the touch display panel as described in the third aspect, and the touch display device has a display function and a touch function.

In a fourth aspect of the present disclosure, a method for manufacturing an array substrate is provided, which is used for manufacturing the array substrate as described in the first aspect and the manufacturing method includes:

forming a gate metal layer on a substrate, and patterning the gate metal layer to form a gate line and a patterned auxiliary metal;

forming an insulating layer on the gate metal layer, and patterning the insulating layer to form a plurality of first holes and a plurality of second holes penetrating the insulating layer;

forming a source and drain metal layer on the insulating layer, and patterning the source and drain metal layer to form source signal lines and touch signal lines, where the touch signal lines are electrically connected to the patterned auxiliary metal through the plurality of first holes;

forming a planarization layer on the source and drain metal layer, and patterning the planarization layer to form a plurality of third holes penetrating the planarization layer; and forming a common electrode layer on the planarization layer, where the patterned auxiliary metal is electrically connected to the common electrode layer through the plurality of second holes and the plurality of third holes.

Optionally, the patterning the planarization layer to form the plurality of third holes penetrating the planarization layer includes:

patterning the planarization layer to form the plurality of third holes and a plurality of fourth holes penetrating the planarization layer, where the plurality of third holes is arranged to be communicated with the plurality of second holes respectively, each of the plurality of fourth holes is arranged between the touch signal line and the planarization layer, and each of the touch signal lines is electrically connected to the planarization layer through one corresponding of the plurality of fourth holes.

BRIEF DESCRIPTION OF THE DRAWINGS

In order to explain the technical solutions in embodiments of the present present disclosure or the related art more clearly, accompanying drawings of the embodiments are briefly illustrated hereinafter. Apparently, the accompanying drawings described hereinafter are only some embodiments of the present present disclosure, and those skilled in the art can further conceive other drawings according to the drawings without creative work.

DETAILED DESCRIPTION

Figure 1:
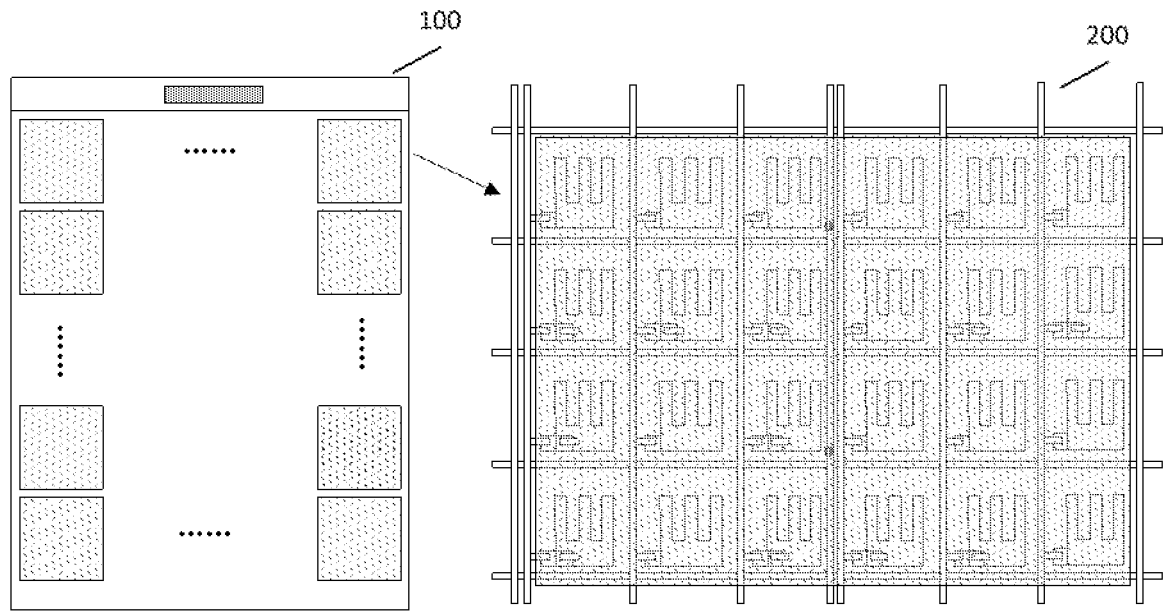
FIG. 1 shows a schematic structural diagram of pixels in touch units in an array substrate in the related art.

In order to explain the present present disclosure more clearly, the present disclosure is further illustrated in conjunction with the drawings and the optional embodiments below. Like reference numerals refer to same or similar functionalities or features in the drawings. It should be understood by those skilled in the art that the present disclosure specifically described below is only as illustrative and not restrictive, but should not be construed as limiting the scope of the present disclosure.

FIG. 1 shows a schematic structural diagram of pixels in touch units in an array substrate in the related art. As shown in FIG. 1, touch signal lines of touch units 200 on an array substrate 100 in the related art are connected to common electrodes through the holes formed in the planarization layer. Since a width of the touch signal line and key factors such as the number, shapes and sizes of the holes have an effect on a contact resistance between the touch signal line and the common electrode, the contact resistance between the touch signal line and the common electrode is large. Moreover, the resistance of the common electrode itself is large, which results in poor display performance and reduces touch sensitivity of the touch display panel, thereby causing the yield of the touch display panel to be low.

Figure 2:
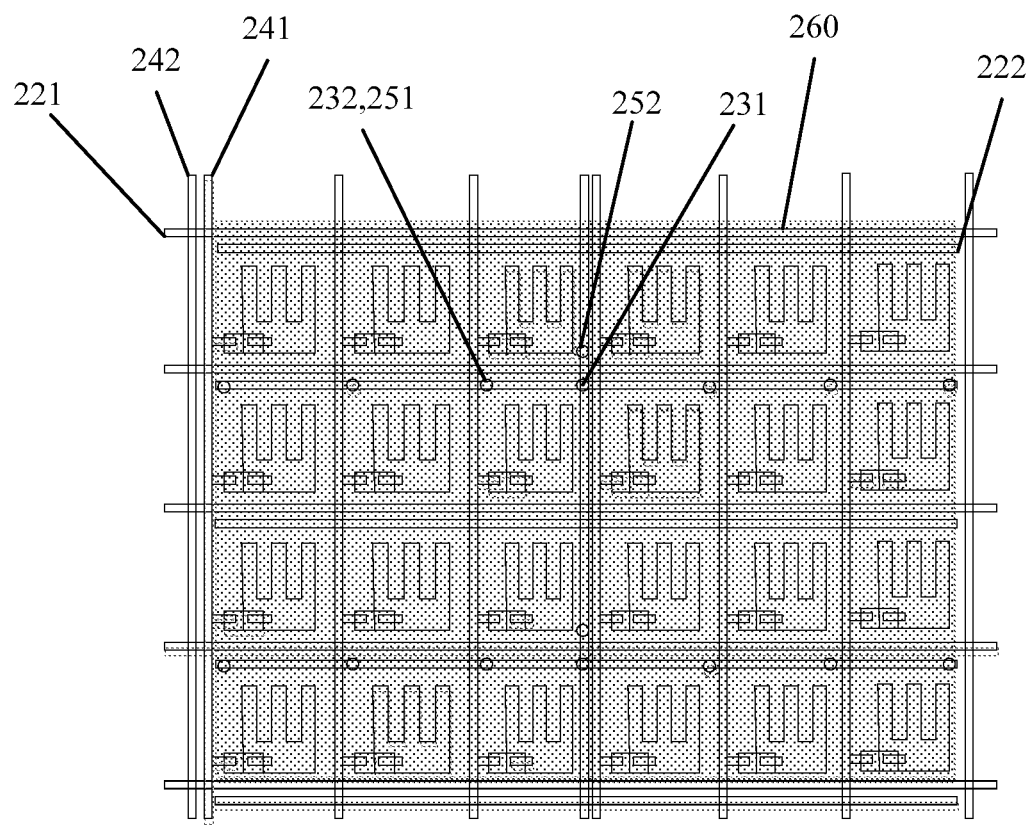
FIG. 2 shows a schematic structural diagram of pixels in touch units in an array substrate according to an optional embodiment of the present present disclosure.

FIG. 2 shows a schematic structural diagram of pixels in touch units in an array substrate according to an optional embodiment of the present present disclosure. As shown in FIG. 2, the array substrate includes: a substrate; a gate metal layer arranged on the substrate, the gate metal layer including a gate line and a patterned auxiliary metal; a source and drain metal layer, the source and drain metal layer including source signal lines and touch signal lines, and the source and drain metal layer being separated from the gate metal layer by an insulating interlayer; an planarization layer arranged on the source and drain metal layer; and a common electrode arranged on the planarization layer. The patterned auxiliary metal is electrically connected to the touch signal lines through first holes penetrating the insulating interlayer, and is electrically connected to the common electrode through second holes penetrating the insulating interlayer and third holes penetrating the planarization layer.

In the embodiment of the present disclosure, the patterned auxiliary metal is arranged in the same layer as the gate line, the patterned auxiliary metal is electrically connected to the touch signal lines and the common electrode to realize the electrical connection between the touch signal lines and the common electrode via the patterned auxiliary metal, which effectively reduces the contact resistance in the electrical connection between the touch signal lines and the common electrode.

Figure 3:
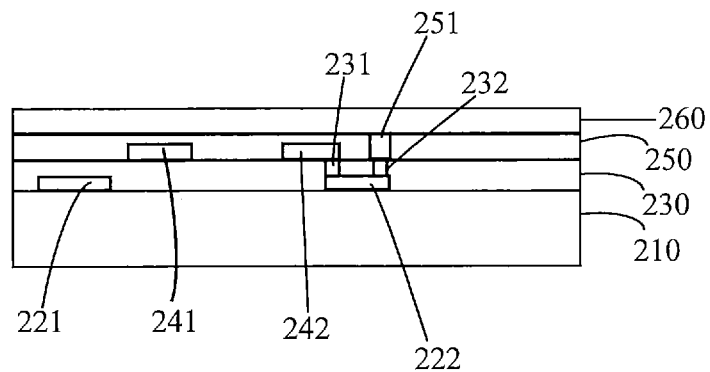
FIG. 3 shows a schematic cross-sectional view of an array substrate according to an optional embodiment of the present present disclosure.

In an optional embodiment of the present disclosure, as shown in FIG. 2 and FIG. 3, the array substrate includes: a substrate 210; a gate line 221 and patterned auxiliary metal 222 arranged in the same layer on the substrate 210; an insulating interlayer 230 arranged on the substrate 210, the gate line and the patterned auxiliary metal, a first hole 231 and a second hole 232 penetrating the insulating interlayer being arranged on the insulating interlayer 230; a source signal line 241 and a touch signal line 242 arranged on the insulating interlayer 230; a planarization layer 250 arranged on the insulating interlayer 230, the source signal line 241 and the touch signal line 242,; and a common electrode 260 arranged on the planarization layer 250. The planarization layer 250 is provided with a third hole 251 penetrating the planarization layer 250. In the embodiment, the first hole 231 is arranged between the patterned auxiliary metal 222 and the touch signal line 242, the patterned auxiliary metal 222 is electrically connected to the touch signal line 242 through the first hole 231. The second hole 232 and the third hole 251 are arranged between the patterned auxiliary metal 222 and the common electrode 260, and the patterned auxiliary metal 222 is electrically connected to the common electrode 260 through the second hole 232 and the third hole 251.

It should be understood that the solution in the present disclosure may be applied to an array substrate with a top-gate structure, an array substrate with a bottom-gate structure, or an array substrate with two gates structure. The top-gate structure or the bottom-gate structure may be designed and the location of the active layer may be determined by those skilled in the art as actual needs, which are not repeated any more for simplicity.

Figure 4:
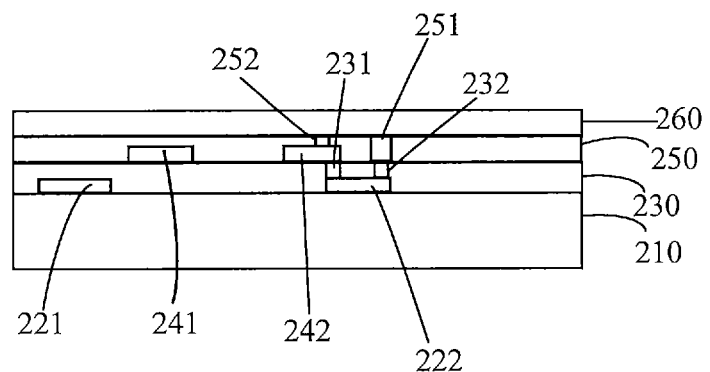
FIG. 4 shows a schematic cross-sectional view of an array substrate according to an optional embodiment of the present present disclosure.

In an optional embodiment of the present disclosure, the array substrate includes a plurality of touch units arranged in an array, and each of the touch units includes at least one touch signal line. Optionally, as shown in FIG. 4, in the array substrate according to the embodiment, the planarization layer 250 further includes a fourth hole 252 arranged between the touch signal line 242 and the common electrode 260, and the touch signal line 242 is electrically connected to the common electrode 260 through at least one of the fourth hole 252 formed in the planarization layer 250. In this way, the common electrode 260 is not only electrically connected to the touch signal line 242 through the patterned auxiliary metal 222, but also directly electrically connected to the touch signal lines 242 only through the fourth hole 252, further reducing the contact resistance between the touch signal line and the common electrode.

Figure 5:
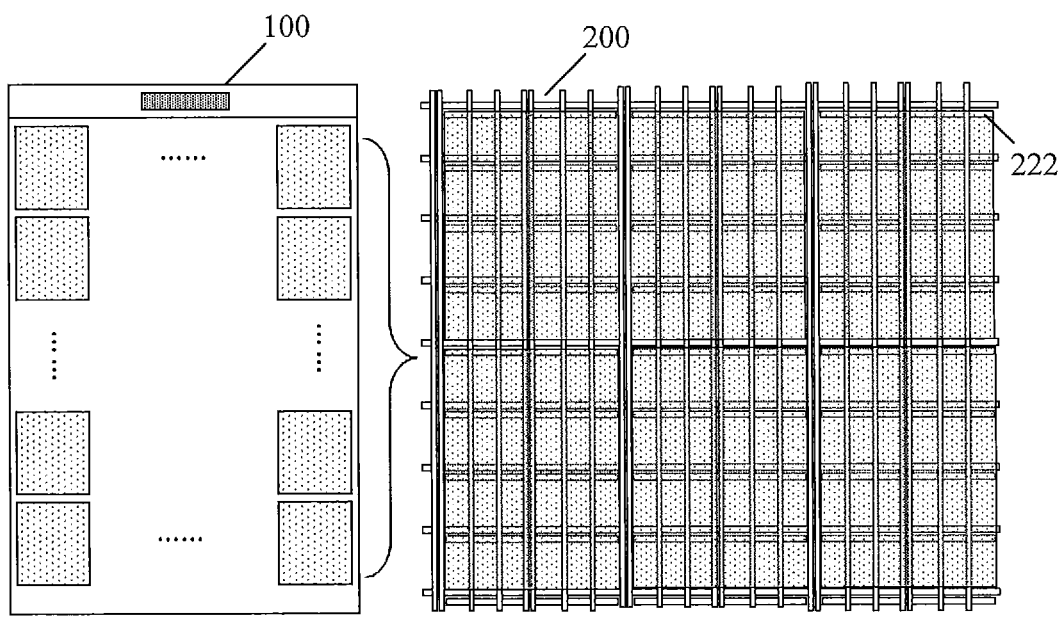
FIG. 5 shows a schematic diagram of the arrangement of touch units in an array substrate according to an optional embodiment of the present present disclosure.

Optionally, the patterned auxiliary metal may be consisted of at least one strip-type auxiliary metal which is parallel to the gate line. With such an arrangement, not only the patterned auxiliary metal can be formed while the gate line is formed, but also the location of the first hole and the second hole formed in the insulating interlayer may be selected. As shown in FIG. 5, the array substrate 100 includes a plurality of touch units 200 arranged in an array, the strip-type auxiliary metal 222 for each of the plurality of touch units 200 is broken off at boundaries of the touch units 200, that is, the strip-type auxiliary metal 222 for each of the touch units 200 is disconnected to avoid the mutual crosstalk between touch signals of the touch units 200. Optionally, the common electrode for each of the touch units is connected to the touch signal line through at least one strip-type auxiliary metal 222, reducing the contact resistance between the touch signal line and the common electrode in the touch units in a case that the touch signal line are directly connected to the common electrode through only the hole in the planarization layer in the related art.

In an optional embodiment of the present disclosure, the second hole is arranged to be communicated with the third hole correspondingly. That is, the second hole formed in the insulating interlayer are directly communicated with the third hole correspondingly formed in the planarization layer without through the touch signal line formed in the source and drain metal layer. In this way, the number of holes formed in the planarization layer which correspond to the touch signal line is reduced, and the contact resistance generated due to the electrical connection between the touch signal line and the common electrode is reduced, thereby reducing the limitation by the shape and the size of the hole and the metal resistance, which is caused due to the arrangement of holes at positions corresponding to the touch signal line. In addition, due to the restriction of the material for manufacturing the common electrode in the related art, the resistance of the common electrode itself is large. According to the present disclosure, the common electrode is directly electrically connected to the patterned auxiliary metal through the second hole and the third hole communicated with each other, which significantly reduces the resistance of the common electrode. Therefore, poor display performance of the touch display panel is improved, touch sensitivity of the touch display panel is improved, and user experience is improved.

Optionally, the second hole and the corresponding third hole are coaxial, effectively reducing the resistance of the common electrode. In some optional embodiments, a diameter of the third hole is greater than that of the corresponding second hole. With the decrease from the diameter of the third hole to that of the second hole, the third hole and the second hole as a whole form one stepped sleeve hole so that there is a slope at the connection between the common electrode layer and the strip-type auxiliary metal. Therefore, a phenomenon that a too thin common electrode layer tends to be broken off at the hole is reduced, and the risk caused by the abnormal connection between the common electrode layer and the strip-type auxiliary metal can be effectively avoided.

A touch display panel is provided according to an embodiment of the present disclosure, and the touch display panel includes the array substrate according to the above-described embodiments. In some optional embodiments, the common electrode and the touch electrode in the array substrate operate in a time-division multiplexing mode. On one hand, the contact resistance between the touch signal line and the common electrode is larger in a case that the touch signal line are directly connected to the common electrode through only the holes in the planarization layer in the touch display panel in the related art. The array substrate included in the touch display panel according to the embodiment of the present disclosure is provided with the patterned auxiliary metal arranged in the same layer as the gate line, the touch signal line is electrically connected to the common electrode through the patterned auxiliary metal with a low resistivity, reducing the contact resistance between the touch signal line and the common electrode. Moreover, the common electrode is connected to the strip-type auxiliary metal through the second hole and the third hole, reducing the resistance of the common electrode, and improving the touch sensitivity of the touch display panel. On the other hand, the common electrode and the touch electrode in the array substrate of the touch display panel operate in a time-division multiplexing mode. The touch signal line transmits a touch signals to the common electrode via the strip-type auxiliary metal to realize the touch function of the display panel in the touch period; the touch signal line can provide a common electrode signal for the common electrode to realize the display function of the display panel in the display period.

In an optional embodiment of the present disclosure, the common electrode is used to display an image in a display period of the touch display panel, and the common electrode is used as a touch electrode for sensing a touch operation in a touch period of the touch display panel. The touch signal line provides a common electrode signal for the common electrode in the display period, and the touch signal line transmits a touch signal to the common electrode via the patterned auxiliary metal in the touch period.

A touch display device is provided according to an embodiment of the present disclosure, and the touch display device includes the touch display panel according to the above-described embodiments. The touch display device may include any product or component having a display and touch function, such as a mobile phone, a tablet computer, a television, a monitor, a notebook computer, a digital picture frame, and a navigating instrument.

Figure 6:
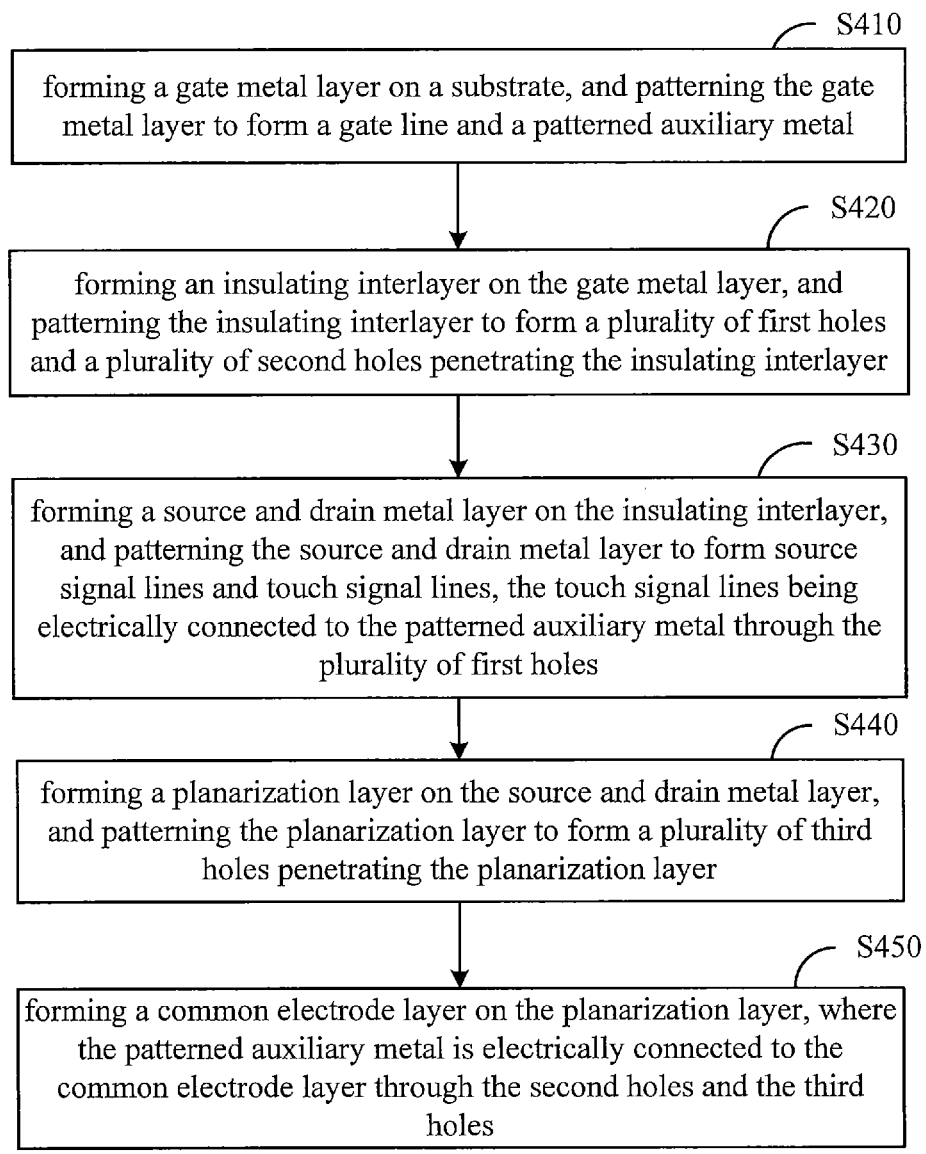
FIG. 6 is a flow chart of a method for manufacturing an array substrate according to an optional embodiment of the present present disclosure.

FIG. 6 is a flow chart of a method for manufacturing an array substrate according to an optional embodiment of the present present disclosure. As shown in FIG. 6, the method for manufacturing an array substrate includes:

S410, forming a gate metal layer on a substrate, and patterning the gate metal layer to form a gate line and a patterned auxiliary metal;

S420, forming an insulating interlayer on the gate metal layer, and patterning the insulating interlayer to form a plurality of first holes and a plurality of second holes penetrating the insulating interlayer;

S430, forming a source and drain metal layer on the insulating interlayer, and patterning the source and drain metal layer to form source signal lines and touch signal lines, the touch signal lines being electrically connected to the patterned auxiliary metal through the plurality of first holes;

S440, forming a planarization layer on the source and drain metal layer, and patterning the planarization layer to form a plurality of third holes penetrating the planarization layer; and S450, forming a common electrode layer on the planarization layer, where the patterned auxiliary metal is electrically connected to the common electrode layer through the second holes and the third holes.

In some optional embodiments of the present disclosure, the step S440 further includes: patterning the planarization layer to form the plurality of third holes and a plurality of fourth holes penetrating the planarization layer. The third holes are arranged to be communicated with the second holes respectively, each of the plurality of fourth holes is arranged between the touch signal line and the planarization layer, and each of the touch signal lines is electrically connected to the planarization layer through one corresponding of the plurality of fourth holes.

In a specific example, as shown in FIG. 3 and FIG. 5, the method for manufacturing an array substrate includes:

providing a substrate 210;

forming a gate metal layer on the substrate 210, and patterning the gate metal layer to form a gate line 221 and a patterned auxiliary metal 222 arranged in the same layer, where the gate line 221 and the patterned auxiliary metal 222 may be arranged in parallel to avoid the crosstalk between scan signals in the gate line 221 and a touch signal in the patterned auxiliary metal 222;

forming an insulating interlayer 230 on the gate metal layer, and patterning the insulating interlayer 230 to form a plurality of first holes 231 and second holes 232 penetrating the insulating interlayer 230;

forming a source and drain metal layer on the insulating interlayer 230, and patterning the source and drain metal layer to form source signal lines 241 and touch signal lines 242 arranged in the same layer, where the source signal lines 241 and the touch signal lines 242 may be arranged in parallel to avoid the crosstalk between data signals in the source signal lines 241 and the touch signals in the touch signal lines 242, and the touch signal lines 242 are electrically connected to the patterned auxiliary metal 222 through the first holes 231;

forming a planarization layer 250 on the source and drain metal layer, and arranging a plurality of third holes 251 penetrating the planarization layer on the planarization layer 250, the third holes 251 being communicated with the second holes 232 correspondingly; and forming a common electrode 260 on the planarization layer 250, where the patterned auxiliary metal 222 is electrically connected to the common electrode 260 through the second holes 232 and the third holes 251 to transmit the touch signals in the touch signal lines 242 to the common electrode 260.

In some optional embodiments of the present disclosure, after arranging the plurality of third holes 251 penetrating the planarization layer on the planarization layer 250, the method further includes: arranging a plurality of fourth holes 252 penetrating the planarization layer on the planarization layer 250. The fourth holes 252 are arranged between the touch signal lines 242 and the planarization layer 250 and are used in electrically connecting the touch signal lines 242 to the planarization layer 250.

As can be seen that, with the method for manufacturing an array substrate according to the embodiments of the present disclosure, the contact resistance between the common electrode and the touch signal line can be effectively reduced and the resistance of the common electrode can be reduced without increasing the manufacturing process steps in the related art. Therefore, poor display performance of the touch display panel is improved, the touch sensitivity of the touch display panel is improved, and the user experience is improved.

The forgoing descriptions are only optional embodiments of the present present disclosure and are not intended to limit the present present disclosure. It should be noted that numerous improvements and substitutions can further be made by those skilled in the art without being departing from the technical principle of the present present disclosure, and those improvements and substitutions shall fall into the scope of protection of the present disclosure.

What is claimed is:

1. An array substrate, comprising:
   a substrate;
   a gate metal layer arranged on the substrate, the gate metal layer comprising a gate line and a patterned auxiliary metal;
   a source and drain metal layer, the source and drain metal layer comprising source signal lines and touch signal lines, and the source and drain metal layer being separated from the gate metal layer by an insulating layer;
   a planarization layer arranged on the source and drain metal layer; and
   a common electrode arranged on the planarization layer, wherein the patterned auxiliary metal is electrically connected to the touch signal lines through first holes penetrating the insulating layer, and is electrically connected to the common electrode through second holes penetrating the insulating layer and third holes penetrating the planarization layer, and
   a plurality of touch units arranged in an array, each of the plurality of touch units comprises at least one touch signal line, and each of the at least one touch signal line is electrically connected to the common electrode through a plurality of fourth holes penetrating the planarization layer.

2. The array substrate according to claim 1, wherein the patterned auxiliary metal comprises at least one strip-type auxiliary metal parallel to the gate line.

3. The array substrate according to claim 1, wherein the patterned auxiliary metal for each of the plurality of touch units is broken off at a boundary of the each touch unit.

4. The array substrate according to claim 3, wherein the patterned auxiliary metal for each of the touch units comprises at least one strip-type auxiliary metal parallel to the gate line.

5. The array substrate according to claim 1, wherein the second holes in the insulating layer are arranged to be communicated with the third holes in the planarization layer correspondingly.

6. The array substrate according to claim 5, wherein each of the second holes and the corresponding third hole are coaxial.

7. The array substrate according to claim 6, wherein a diameter of each of the third holes is larger than a diameter of the corresponding second hole.

8. A touch display panel, comprising: an array substrate, wherein the array substrate comprises:
   a substrate;
   a gate metal layer arranged on the substrate, the gate metal layer comprising a gate line and a patterned auxiliary metal;
   a source and drain metal layer, the source and drain metal layer comprising source signal lines and touch signal lines, and the source and drain metal layer being separated from the gate metal layer by an insulating layer;
   a planarization layer arranged on the source and drain metal layer; and
   a common electrode arranged on the planarization layer, wherein the patterned auxiliary metal is electrically connected to the touch signal lines through first holes penetrating the insulating layer, and is electrically connected to the common electrode through second holes penetrating the insulating layer and third holes penetrating the planarization layer, and a plurality of touch units arranged in an array, each of the plurality of touch units comprises at least one touch signal line, and each of the at least one touch signal line is electrically connected to the common electrode through a plurality of fourth holes penetrating the planarization layer.

9. The touch display panel according to claim 8, wherein the patterned auxiliary metal for each of the plurality of touch units is broken off at a boundary of the each touch unit.

10. The touch display panel according to claim 8, wherein the patterned auxiliary metal comprises at least one strip-type auxiliary metal parallel to the gate line.

11. A touch display device, comprising the touch display panel according to claim 8, wherein the touch display device has a display function and a touch function.

12. The touch display panel according to claim 8, wherein the common electrode is used to display an image in a display period of the touch display panel, and the common electrode is used as a touch electrode for sensing a touch operation in a touch period of the touch display panel.

13. The touch display panel according to claim 12, wherein the touch signal lines provide common electrode signals for the common electrode in the display period, and the touch signal lines transmit touch signals to the common electrode via the patterned auxiliary metal in the touch period.

14. The touch display panel according to claim 8, wherein the second holes in the insulating layer are arranged to be communicated with the third holes in the planarization layer correspondingly.

15. The touch display panel according to claim 14, wherein each of the second holes and the corresponding third hole are coaxial.

16. The touch display panel according to claim 15, wherein a diameter of each of the third holes is larger than a diameter of the corresponding second hole.

17. A method for manufacturing an array substrate, comprising:

forming a gate metal layer on a substrate, and patterning the gate metal layer to form a gate line and a patterned auxiliary metal;

forming an insulating layer on the gate metal layer, and patterning the insulating layer to form a plurality of first holes and a plurality of second holes penetrating the insulating layer;

forming a source and drain metal layer on the insulating layer, and patterning the source and drain metal layer to form source signal lines and touch signal lines, wherein the touch signal lines are electrically connected to the patterned auxiliary metal through the plurality of first holes;

forming a planarization layer on the source and drain metal layer, and patterning the planarization layer to form a plurality of third holes penetrating the planarization layer; and forming a common electrode layer on the planarization layer, wherein the patterned auxiliary metal is electrically connected to the common electrode layer through the plurality of second holes and the plurality of third holes, wherein the patterning the planarization layer to form the plurality of third holes penetrating the planarization layer comprises:

patterning the planarization layer to form the plurality of third holes and a plurality of fourth holes penetrating the planarization layer, wherein the plurality of third holes is arranged to be communicated with the plurality of second holes respectively, each of the plurality of fourth holes is arranged between the touch signal lines and the planarization layer, and each of the touch signal lines is electrically connected to the planarization layer through one corresponding of the plurality of fourth holes.

* * * * *